(12) United States Patent
Stoeldraijer et al.

(10) Patent No.: US 6,404,499 B1
(45) Date of Patent: Jun. 11, 2002

(54) LITHOGRAPHY APPARATUS WITH FILTERS FOR OPTIMIZING UNIFORMITY OF AN IMAGE

(75) Inventors: Judocus M. D. Stoeldraijer, Hapert; Jan W. R. Ten Cate, Staphorst; Franciscus H. A. G. Fey; Joost Sytsma, both of Eindhoven, all of (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/293,000

(22) Filed: Apr. 16, 1999

(30) Foreign Application Priority Data

Apr. 21, 1998 (EP) .............................. 98201278

(51) Int. Cl.$^7$ ............................................. G01B 11/00
(52) U.S. Cl. .................................. 356/400; 250/492.22
(58) Field of Search .................... 356/400; 250/492.22; 430/5

(56) References Cited

U.S. PATENT DOCUMENTS

| | | | |
|---|---|---|---|
| 4,053,906 A | * 10/1977 | Schultz | ........................ 354/1 |
| 4,598,197 A | 7/1986 | Morita et al. | |
| 5,446,521 A | * 8/1995 | Hainsey et al. | ................ 355/53 |
| 5,486,896 A | 1/1996 | Hazama et al. | |
| 5,561,008 A | 10/1996 | Berger et al. | |
| 5,677,939 A | * 10/1997 | Oshino | ........................ 378/34 |
| 5,684,565 A | * 11/1997 | Oshida et al. | ................ 355/53 |
| 5,966,202 A | * 10/1999 | McCullough | ................ 355/67 |
| 6,049,374 A | * 4/2000 | Komatsuda et al. | .......... 355/67 |
| 6,051,842 A | 4/2000 | Yamamoto | |

FOREIGN PATENT DOCUMENTS

| | | |
|---|---|---|
| EP | 0869396 | 10/1998 |
| JP | 10-199800 | 7/1998 |

* cited by examiner

Primary Examiner—Frank G. Font
Assistant Examiner—Philip Sana Natividad
(74) Attorney, Agent, or Firm—Pillsbury Winthrop LLP

(57) ABSTRACT

A lithographic projection apparatus has a correction device for lithographic projection. The lithographic projection apparatus has a projection system that projects a beam of radiation onto a mask. The correction device has a filter unit placed in the path of the beam for varying the spatial intensity of the beam along at least one direction of its cross-section so that the integrated intensity of radiation of mask level is substantially uniform across the entire length or the cross-section.

22 Claims, 3 Drawing Sheets

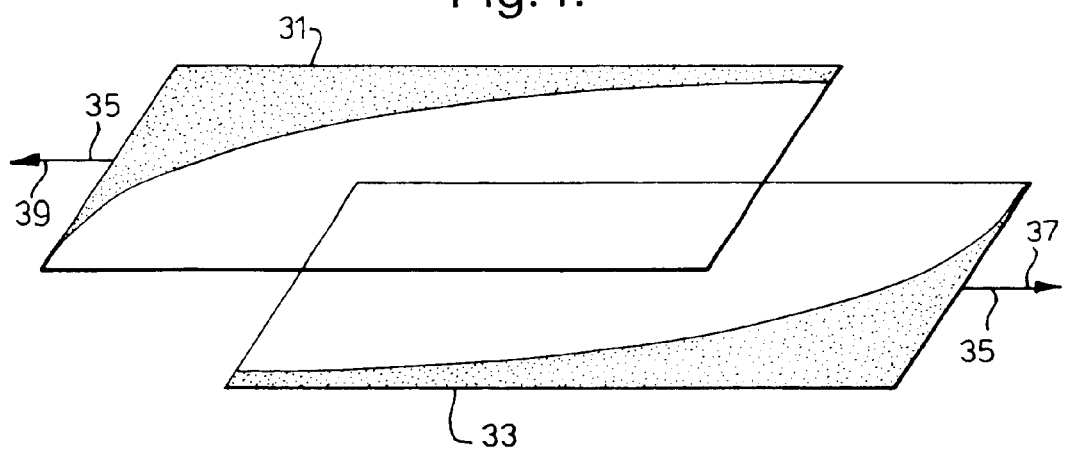
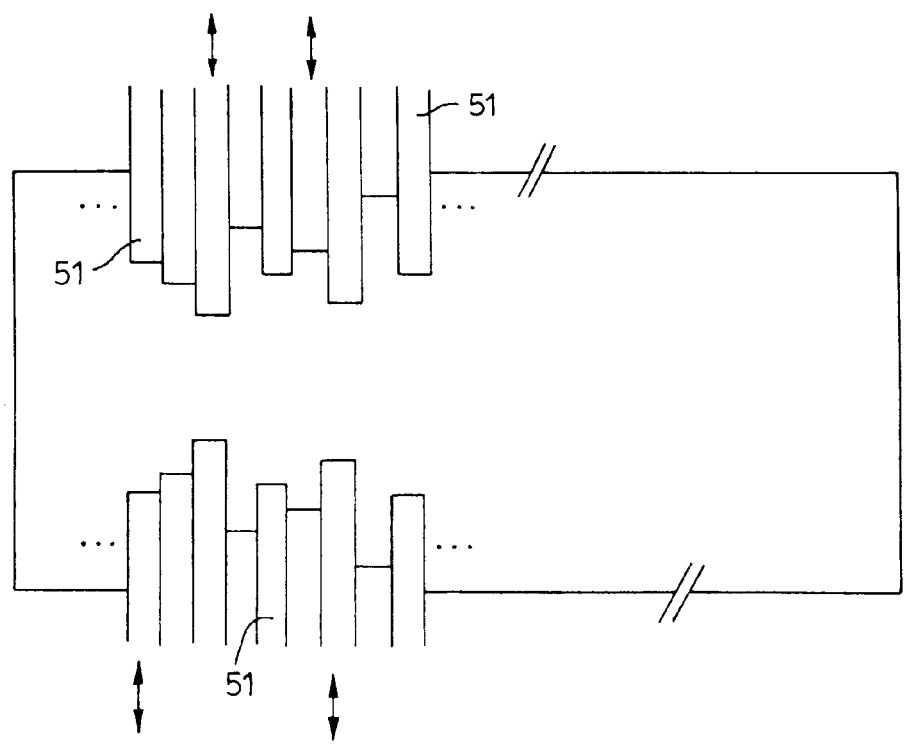

LITHOGRAPHY APPARATUS WITH FILTERS FOR OPTIMIZING UNIFORMITY OF AN IMAGE

BACKGROUND OF THE INVENTION

1. Field of the Invention

The present invention relates to the field of lithography. In particular, the present invention provides a device for optimising the uniformity of an image in a lithographic projection system.

2. Discussion of Related Art

For the sake of simplicity, the projection system may hereinafter be referred to as the "lens"; however, this term should be broadly interpreted as encompassing various types of projection system, including refractive optics, reflective optics and catadioptric systems, for example. The radiation system may also include elements operating according to any of these principles, for directing, shaping or controlling the projection beam of radiation, and such elements may also be referred to below, collectively or singularly, as a "lens". Any refractive, reflective or catadioptric elements in the radiation or illumination systems may be based on a substrate of glass or another suitable material, and may be provided with either single- or multi-layer coatings as desired. In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatuses are described in International Patent Applications WO98/28665 and WO98/40791.

In lithography apparatuses, a mask (reticle) is irradiated. The mask has a pattern made from regions which either transmit radiation or block radiation; alternatively, so-called phase modulation (PSM) may be employed. The pattern on the mask is thus projected onto a substrate, typically of semiconductor material. The substrate (e.g. a wafer) is covered with a radiation-sensitive layer. Hence, the pattern on the mask is transferred onto the substrate.

A photolithographic apparatus of the construction described above and being usable, inter alia, in the manufacture of integrated circuits (ICs), is known, for example, from U.S. Pat. No. 5,194,893.

Due to the demand for an increasingly large number of electronic components in one IC, increasingly smaller details, also referred to as line widths, must be imaged by means of the projection apparatus in each area of the substrate on which an IC must be formed, which area is also referred to as IC area or "die". One also wants to enlarge these IC areas so as to increase the number of components per IC. For the projection lens system this means, on the other hand, that the resolving power, hence its numerical aperture, must be raised and, on the other hand, that the image field must be enlarged. It is difficult to unite these two disparate requirements in a conventional lens.

This dilemma can be circumvented by changing from a so-called step-projection apparatus to a step-and-scan apparatus as described in U.S. Pat. No. 5,194,893 for example. In a step-projection apparatus, the complete mask pattern is illuminated and imaged as a whole on a target area on the substrate, for example, a wafer die or IC area. Subsequently, a step is made, i.e. the substrate is moved with respect to the projection lens system and the mask pattern, until a second target area is present opposite the mask pattern and within the image field of the projection lens system, and a second image of the mask pattern is formed in that area. Subsequently, the apparatus steps to a third target area and the mask pattern is imaged again, and so forth, until images of the mask pattern have been formed in all target areas.

In a step-and-scan apparatus, the same stepping movements are performed, but each time only a small part of the mask pattern is imaged on a corresponding sub-area of the target area. By imaging successive parts of the mask pattern on successive sub-areas of the target area in a scanning motion, an image of the complete mask pattern is obtained on a target area.

To this end, the pattern on the mask is illuminated with a projection beam which forms a small, for example, rectangular or arcuate illumination spot at the location of the mask pattern. In order to move the mask and the substrate, the mask is held on a mask table and the substrate is held on a substrate table. The mask table and the substrate table are moved (scanned) in the same direction or in mutually opposite directions along the scan direction, with respect to the projection lens system and the projection beam, the speed of the substrate being M times that of the mask table, where M is the magnification with which the mask pattern is imaged onto the substrate.

A commonly used value for M is ¼ or ⅕. Other values of M, for example 1, are alternatively possible. Said movement of the mask table and the substrate table with respect to the illumination spot is referred to as the scan movement. The illumination spot has its largest dimension in the direction transverse to the scan direction. This dimension may be equal to the width of the mask pattern, so that this pattern is imaged in one scan movement. However, it is alternatively possible that said dimension is half the mask pattern width or even smaller. In that case, the complete mask pattern can be imaged by performing two, or a larger number of, opposed scan movements.

It should then be ensured that the mask and the substrate have the correct mutual position and speed at any moment, which can be realised by means of a very accurate synchronisation of the movements of the mask and substrate tables, i.e. the speed $V_{sub}$ of the substrate should always be equal to M times the speed $v_{ma}$ of the mask.

To this end the apparatus may, for example, comprise a first and a second interferometer system for continuously measuring, during each imaging operation, the mutual position of the mask and the substrate.

Lithographic projection apparatuses may employ a projection beam of electromagnetic radiation, such as UV radiation, e.g. with a wavelength of 365 nm, 248 nm, 193 nm or 157 nm, or extreme UV, with a wavelength of the order of 15 nm. Alternatively such apparatus may employ a projection beam of charged-particle radiation, such as electron radiation or ion radiation, in which case an associated field-lens projection system is used.

More information with regard to lithographic devices as here described can be gleaned from International Patent Application WO97/33205, for example.

There is a need to produce smaller and smaller semiconductor devices, and thus a corresponding need to improve the so-called critical dimension (CD) uniformity. Thus, these lithography apparatuses are being pushed to their resolution limits. Therefore, there is a need to minimise factors which can affect the resolution of the apparatus.

It is critical to produce a uniform light distribution at substrate level to achieve a high CD uniformity at high resolutions. It is an object of the present invention to produce a uniform light distribution at substrate level (in the absence of a mask).

Many different factors can affect the uniformity of the light produced at the substrate level. For example, the uniformity is dependent on factors such as the presence of a diaphragm e.g. so called REMA (reticle masking) blades, films formed on optical elements e.g. anti-reflective coatings, water, organic films formed on the illuminator, back reflections and contamination. Therefore, it is desirable if the effect of these factors on the light distribution at substrate level can be minimised.

It is known to place devices in the path of the employed radiation beam to vary the light intensity incident on the reticle. For example, U.S. Pat. No. 5,486,896 uses a device which decreases the light intensity at the sides of the beam. This device has two diaphragms which intercept the edges of the beam. In one embodiment, small filter strips are placed on the inner edges of the diaphragm to create a smoother transition from light to dark at the edges of the beam.

This known device was designed to solve a problem which occurs in some scanning systems where the edges of the beam overlap when two adjacent sections of the wafer are scanned (so-called stitching problems). This results in overexposure at the edges of the scanning region.

The problems addressed by the present invention are far more complex and cannot be solved by just attenuating the light signal at the edges of the beam. The present invention is aimed at the requirement to modulate the spatial beam intensity along a given direction of the beam cross-section.

SUMMARY OF THE INVENTION

The present invention provides a device for optimizing the uniformity of an image in a lithographic projection system comprising: a radiation system for supplying a projection beam of radiation, a first object table provided with a mask holder for holding a mask, and connected to first positioning means, a second object table provided with a substrate holder for holding a substrate and connected to second positioning means, a projection system for imaging an irradiated portion of the mask onto a target portion of the substrate.

In a first aspect, the present invention provides a lithographic projection apparatus having:

- a radiation system comprising a source of radiation, for supplying a projection beam the cross-section of which, in the plane of a mask, is smaller than the mask pattern;
- a mask table being movable in at least a first (scan) direction and being provided with a mask holder in which the mask can be held;
- a projection system for imaging an irradiated part of the mask pattern onto the substrate with a magnification M;
- a substrate table which is movable along the first direction and along a second direction perpendicular thereto, and is provided with a substrate holder in which the substrate can be held;
- mask table drive device for moving the mask table during each imaging operation along at least the first direction, with respect to the projection beam and the projection system; and
- substrate table drive device for moving the substrate table during each imaging operation along at least the first direction at a rate equal to M times the rate at which the mask table is moved.

The lithographic projection apparatus further comprises a correction device, the correction device comprising a filter unit placed in the path of the beam for varying the spatial intensity of the beam along at least one direction of its cross-section, so that the integrated radiation intensity at substrate level is substantially uniform across substantially the entire length of that cross-section.

In a second aspect, the present invention provides a correction device for a lithographic projection apparatus, wherein the lithographic projection apparatus comprises a projection system that projects a beam of radiation onto a mask. The correction device comprises a filter unit placed in the path of the beam for varying the spatial intensity of the beam along at least one direction of its cross-section so that the integrated radiation intensity at substrate level is substantially uniform across the entire length of that cross-section.

For the avoidance of doubt, as used herein, the term "filter unit" refers to any device that blocks or partially blocks and/or reduces the intensity of the incident radiation. The term is not intended to be limited to device for blocking certain radiation energies or frequencies.

References to the spatial uniformity of the beam at substrate level of course refer to the uniformity in the absence of projected mask features.

The term substantially uniform preferably means a percentage variation in the uniformity of less than 1.5%. More preferably, the percentage variation is less than 0.5%.

In general, the beam cross-section will have the form of an elongated rectangle (e.g. with dimensions of the order of 10 mm×26 mm). A so-called "reference direction" is now defined as being the direction of the long side of such a cross-section. In alternative arrangements, the beam cross-section may, for example, be square or circular; in such cases, the reference direction may be taken as being parallel to one of the sides of the square or one of the diameters of the circle, respectively.

Preferably, the filter unit comprise a first member which is located in the path of the beam. The integrated intensity of the radiation is modulated by moving the first member with respect to the beam along a movement axis. Movement of the first member refers to movement of the first member in its entirety or movement of a part of the first member with respect to the beam.

In a first preferred embodiment of a lithographic projection apparatus according to a first aspect of the present invention, and a correction device according to a second aspect of the present invention, the first member is a single filter. The filter is placed in the path of the beam and oriented such that there is a variation in its transmittance with respect to directions parallel and perpendicular to the movement axis. The filter is moved in its entirety with respect to the beam. In a preferential embodiment, the movement axis is perpendicular to the reference direction.

Thus, the filter can be provided with a plurality of specific transmission profiles arranged parallel to one another, each transmission profile being arranged perpendicular to the movement axis, such that a particular transmission profile can be chosen by moving the filter along the movement axis. Thus, the uniformity of the integrated intensity of the beam cross-section can be dynamically corrected by the movement of the first filter.

Preferably, the plurality of specific transmission profiles provides a continuum of constantly varying transmission profiles, i.e. the plurality of profiles defines a substantially continuously differentiable function with respect to spatial variables taken along the said direction of movement and a direction perpendicular thereto (Y and X axes). The particular function is preferably the reciprocal of the integrated radiation intensity sampled at (differential) intervals parallel to the reference direction.

The first filter is a continuous member, such that the whole cross-sectional area of the beam is incident on the filter member. In other words, the filter does not partially intersect the beam; if it did, there is a chance that light could be reflected from the edges of the filter which would further affect the uniformity of the integrated intensity of the beam at substrate level.

When the filter is moved to place a new transmission profile in the path of the beam, the filter is still positioned so that an edge of the filter does not intersect the beam. Hence, no spurious reflections due to the correction device itself are caused.

In a second embodiment, the first member has two filters. The second filter is movable along the said movement axis. The second filter is movable relative to said first filter.

It is even more preferable if the second filter overlies the first filter such that at least one transmission profile on each of the first and second filters overlap one another. The first and second filters have linear transmission profiles and the filters are oriented such that the linear transmission profiles on the first filter slope in opposite direction to the linear transmission profiles on the second filter. Put another way: when viewed in a direction perpendicular to the plane of the beam cross-section, the second filter is a mirror image of the first filter. In this way, the pupil (slit) illumination remains symmetrical, so as to overcome telecentricity problems.

Preferably either or both of the filter members are grey filters (absorption, continuous, reflection or dithered).

More preferably, the lithography apparatus further comprises a condenser lens group or REMA lens which is located between the mask and the source of the radiation, the first member being placed between the condenser lens group or REMA lens and the mask. Alternatively, the first member can be placed on the side of the mask remote from the source of radiation.

More preferably, the first member is located immediately above the level of the mask or at an optically conjugate position.

Preferably, for a filter member composed of discrete dots, such as a dithered filter comprised of for example 50-micron randomly distributed dots, the member is located at a defocused position to average out the dots at the mask or substrate level.

Even more preferably, the device further comprises a control unit for controlling the movement unit, responsible for effecting movement of the first member, such that the first member is positioned to optimise the uniformnity of the spatial intensity of the beam incident on the substrate.

Even more preferably, the control unit provides continuous control of the uniformity of the spatial intensity of the beam incident on the substrate by continually moving the filter in such a way that the best possible uniformity can be achieved at all times.

In a third embodiment, the first member comprises a plurality of independently movable fingers, the fingers being mutually adjacent and movable independently relative to each other, back and forth, to intersect at least part of the beam cross-section. To clarify, the fingers are arranged side-by-side along the reference direction, the fingers being movable perpendicular to this direction.

Preferably, the elongate fingers are oriented substantially perpendicular to the reference direction.

Preferably, the width of each finger in a direction parallel to the reference direction is chosen so as to constitute from 3% to 7% of the length of the slit in the reference direction.

In that case, there will be of the order of about 15 to 25 fingers side-by-side along the reference direction. For example, in the case of a slit measuring 10 mm by 26 mm, one can chose each finger to be 1 mm long, so that there are 26 fingers side-by-side along the reference direction.

Means for moving the above plurality of fingers will be apparent to a person skilled in the art. For example, each finger could be directly or indirectly attached to a small motor.

A further problem addressed by the present invention is to provide an improved filter. As explained above, filters in which the transmission varies with position may be used to improve illumination uniformity and hence CD uniformity, and may also be used in many other applications. Often the transmission profiles can be rather complex. Previously, asymmetric filters (filters without rotational symmetry) have been "continuous" or analogue filters, in which the transmission profile changes gradually in a continuous way with position on the filter plate. The transmission is tuned either by varying the thickness of a dielectric coating (i.e. tuning the reflectance) or by varying the thickness of an absorbing coating (e.g. a metal layer). However, in practice it is very difficult to control layer thickness, especially when the thickness varies with position. As a result, filter transmission profiles often have the wrong profile and/or amplitude.

In order to alleviate this problem, the invention provides a filter (also called a digital filter) in which the transmission varies with position through varying the density of radiation-blocking dots.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping) metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of apparatuses according to the invention in the manufacture of ICs, it should be explicitly understood that such apparatuses have many other possible applications, especially where exposure conditions vary (e.g. Numerical Aperture, degree of coherence (i.e. sigma setting), degradation of the optics, etc). For example, it may be employed in the manufacture of integrated optical systems, guidance and detection patterns for magnetic domain memories, liquid-crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

The present invention will now be explained in more detail by reference to the following non-limiting preferred embodiments and with reference to the accompanying drawings, in which:

FIG. 4 is a schematic diagram of a second embodiment of a correction device according to the present invention; and FIG. 5 is a schematic diagram of a third embodiment of a correction device according to the present invention.

Figure 1:
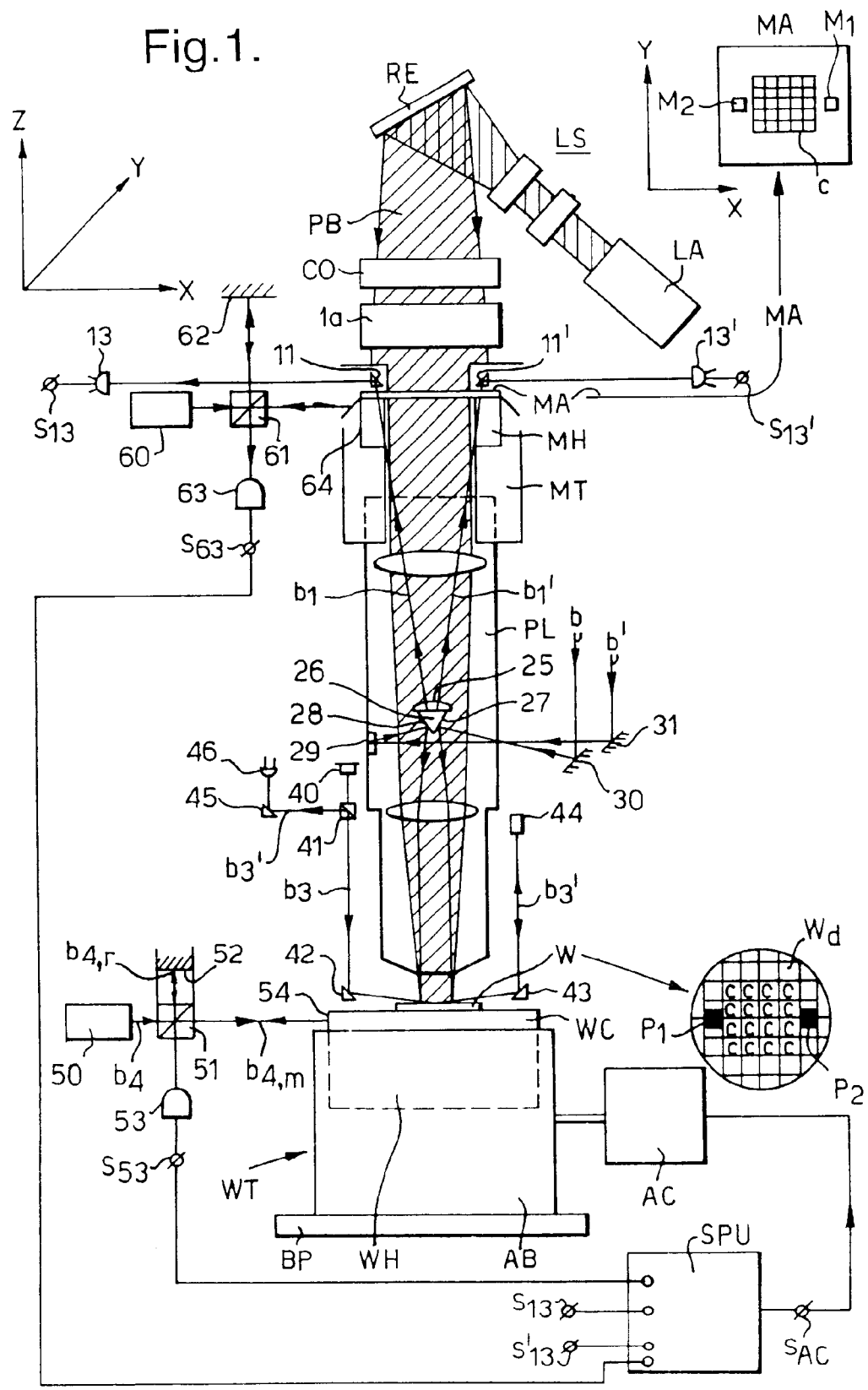
FIG. 1 is a step and scan imaging system in accordance with a first aspect of the present invention.

FIG. 1 shows diagrammatically the optical elements of an apparatus for repetitive step-and-scan imaging of a mask pattern on a substrate. The main component of this apparatus is a projection column accommodating a projection system PL. A mask holder MH for a mask MA, in which the mask pattern C to be imaged is provided, is arranged above this system. The mask holder is present in a mask table MT. A substrate table WT is arranged below the projection system PL. This table accommodates a substrate holder WH for a substrate W on which the mask pattern must be imaged a number of times, each time in a different substrate area (e.g. an IC area) Wd. The substrate table is movable in the X and Y directions so that, after imaging of the mask pattern on an IC area, a subsequent IC area can be positioned underneath the mask pattern.

As here depicted, the apparatus is transmissive; however, it may alternatively comprise reflective or catadioptric optical systems, for example.

The correction device 1a is located in the path of the projection beam PB before the mask MA. The correction device 1a is stationary with respect to the beam PB during scanning.

The apparatus further has an illumination system which comprises a radiation source LA, for example a Krypton-Fluoride Excimer Laser or a mercury lamp, a lens system LS a mirror RE and beam-shaping optics CO. The projection beam PB supplied by the illumination system illuminates the mask pattern C. This pattern is imaged by the projection system PL on an area in the substrate W. The projection system has, for example, a magnification of M=¼, a numerical aperture NA=0.6 and a diffraction-limited image field having a diameter of 22 mm.

The apparatus further comprises a plurality of measuring devices, namely a device for aligning the mask MA with respect to the substrate W in the XY plane, an interferometer system for determining the position and orientation of the substrate holder and hence of the substrate, and a focus-error detection device for determining a deviation between the focal or image plane of the projection system PL and the surface of the substrate W. Also included (but not depicted) are sensor means with which the light distribution at wafer level can be calibrated. These measuring devices are parts of servosystems which comprise electronic signal-processing and control circuits and drivers, or actuators, with which the position and orientation of the substrate and the focussing can be corrected with reference to the signals supplied by the measuring devices.

The alignment device referred to in the previous paragraph uses two alignment marks M1 and M2 in the mask MA, indicated in the top right corner of FIG. 1. These marks preferably consist of diffraction gratings, but they may be alternatively formed by other marks, such as squares or strips which are optically different from their surroundings. The alignment marks are preferably two-dimensional, i.e. they extend in two mutually perpendicular directions, the X and Y directions in FIG. 1. The substrate W (for example, a semiconductor substrate on which the pattern C must be imaged repetitively at adjacent positions) has at least two alignment marks, preferably also two-dimensional diffraction gratings, two of which, P1 and P2, are located outside the areas on the substrate W where the images of the pattern C must be formed. The grating marks P1 and P2 are preferably phase gratings and the grating marks M1 and M2 are preferably amplitude gratings.

Figure 2:
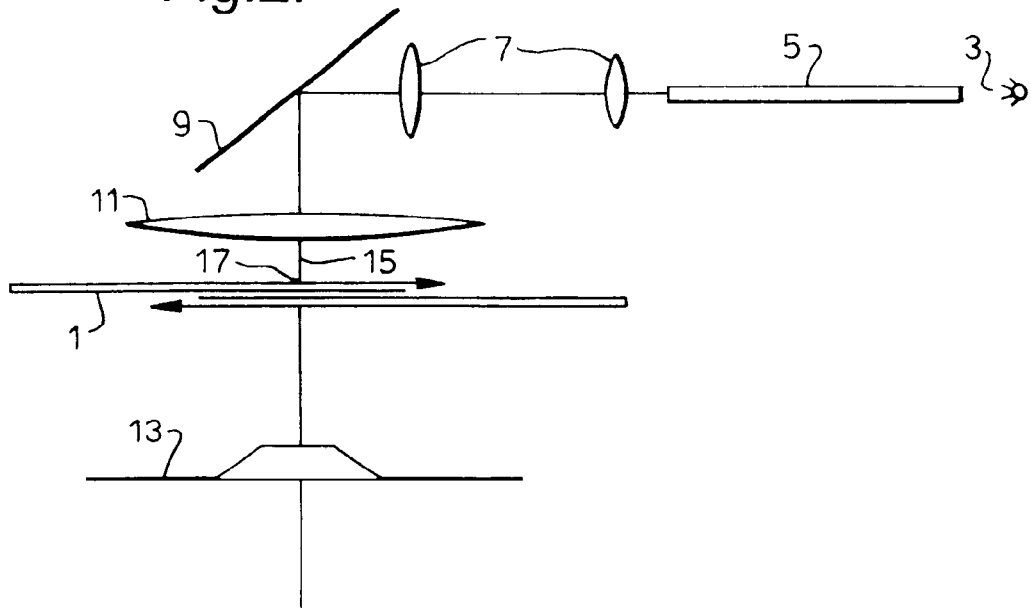
FIG. 2 is a simple schematic showing a correction device according to the present invention.

FIG. 2 shows a simple schematic of lithographic apparatus with a correction device 1, both according to the present invention. The apparatus has a light source 3 which emits a beam of electromagnetic radiation which traverses light guide 5 through lenses 7. The beam is reflected off mirror 9 and is directed through condenser group lenses 11 through correction device 1 and onto the reticle 13.

The light beam 15 has a narrow rectangular cross-section. This type of beam cross-section is often used with a scanning apparatus. In scanning apparatuses the beam is usually scanned in a direction perpendicular to the elongate direction of its cross-section. This results in averaging or integrating effects on the radiation dose perpendicular to this elongate direction, but not on the uniformity of the intensity distribution parallel to the elongate direction. The correction devices shown in FIGS. 3a to 5 are to be used with a beam of the above cross-section. However, it will be appreciated by those skilled in the art that these devices, with minor modifications, can be used with a variety of beam cross-sections.

The correction device shown in FIG. 2 is shown in more detail in FIG. 4. However, for the purposes of the following description, the correction device 1 of FIG. 2 will be thought of as a generic filter unit. The beam 15 impinges on the filter unit at point 17. In the position shown in the diagram, the beam is transmitted through a filter with a transmission profile. Constituent parts of the device 1 can be moved relative to the beam 15 to change the filter transmission profile at point 17. Thus, the spatial intensity of the beam 15 on the reticle 13 can be modulated.

Ideally, the integrated intensity of the beam at reticle level should be substantially uniform. The correction device 1 is designed so that the beam 15 can be transmitted through a plurality of different transmission profiles. Thus, the spatial variation of the beam intensity at reticle level can be modulated.

Figure 3A:
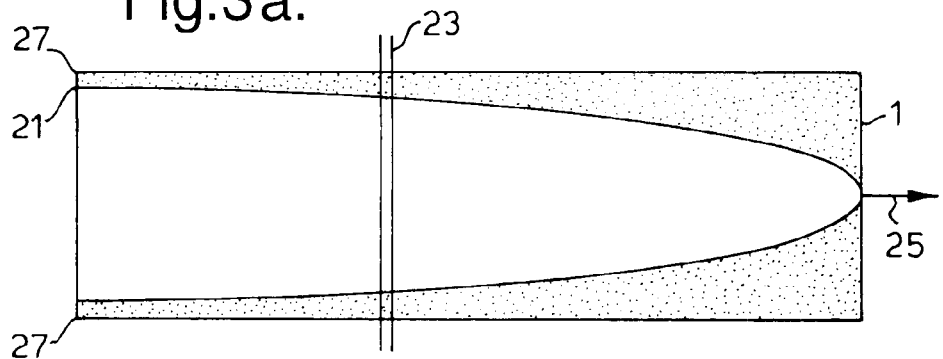
FIGS. 3a and 3b are schematic diagrams of a first embodiment of a correction device according to the present invention.

FIG. 3a shows a correction device 1 which is a single filter 21. The filter has a variation in its transmittance both along the movement axis 25 and perpendicular to the movement axis 25. The filter has a continuum of different transmission profiles arranged parallel to one another along the movement axis 25. In use, the filter 21 will intersect a beam at line 21. The filter 21 is movable along movement axis 25. The filter 21 is movable relative to the beam so that a plurality of different transmission profiles can be positioned at line 23.

Figure 3B:
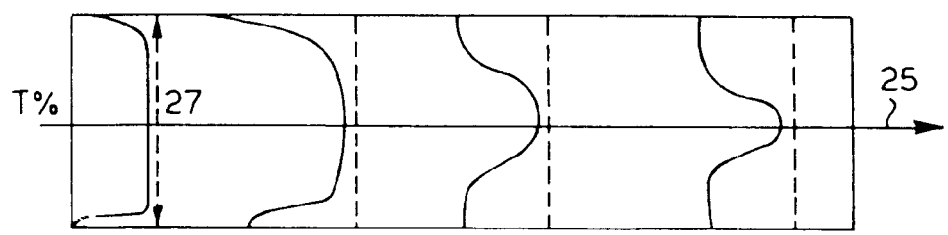

FIG. 3b shows a plot of four schematic transmission profiles which can be selected by moving the filter 21 along the movement axis 25.

FIG. 4 shows a correction device 1 with two filters 31 and 33. Both filters are movable along movement axis 35; one filter is movable in direction 37 and the second filter is movable in direction 39. The filters overlap so that the beam 15 passes through both filters. Essentially, the transmission profile on the upper filter 31 is a rotation of the pattern on the lower filter 33 through 180°. The filters 31 and 33 are moved in opposing directions to each other to produce a symmetric transmission profile, which varies linearly.

In a further variant, the correction device comprises a stack of paired filters, with each pair (mirror images of each other, varying oppositely in scanning direction) correcting independently for a specific order of the power-expansion of the intensity profile in the non-scanning direction. For example, one pair can be used for the zero-order (i.e. intensity) correction. This pair will act as a variable attenuator. Another pair can be used for first-order uniformity profile correction. This pair will remove tilt. A further pair can be used for second-order correction (concave or convex profiles), and so on for third and subsequent order correction as desired.

A particular embodiment of the invention can make use of a digital filter. A digital filter is a filter in which the transmission varies with position through a varying of the density of light blocking dots. So the varying transmission values of the filter can be obtained by 1 bit digital halftoning. An exemplary design of such a filter is a reticle, i.e. a glass plate with small chromium dots on it. Light incident on the chromium dots is blocked. Note that a wide variety of digital halftoning techniques are suitable for digital filters, including multi-bit (grayscale) halftoning. Digital filter technology offers high flexibility (any profile can be generated) and the reproducibility is very good. Digital filters for the image plane can be used provided they are located some distance away from the image plane. The defocus will eliminate the discrete nature of the filter transmission profile, resulting in a continuous effective transmission profile in the image plane.

FIG. 5 shows a third embodiment of the filter unit. A plurality of fingers 51 are arranged side-by-side and adjacent one another. The fingers are arranged in two sets which face each other. Each set is arranged along the elongate beam direction. The fingers 51 are independently movable in a direction perpendicular to the elongate beam direction (i.e. in the movement direction). Each finger can be positioned anywhere between a position where it is out of the path of the beam or where it extends half way across the beam cross-section. Thus, each finger can be positioned so that an optimum transmission profile is achieved. (For clarity purposes, only 9 fingers of each set of fingers are explicitly shown in FIG. 5. The dotted lines indicate the full extent of each set of fingers.)

It should be explicitly noted that the filters referred to hereabove may be embodied for use in transmissive or reflective optical systems.

We claim:

1. A lithographic projection apparatus comprising:
   a radiation system comprising a source of radiation, said radiation system supplying a projection beam the cross-section of which in the plane of a mask is smaller than a mask pattern;
   a mask table being movable in at least a first direction and being provided with a mask holder in which the mask can be held;
   a projection system constructed and arranged to image an irradiated part of the mask pattern onto a substrate with a magnification M;
   a substrate table which is movable along the first direction and along a second direction perpendicular thereto, and is provided with a substrate holder in which the substrate can be held;
   a mask table drive device constructed and arranged to move the mask table during each imaging operation along at least the first direction, with respect to the projection beam and the projection system;
   a substrate table drive device constructed and arranged to move the substrate table during each imaging operation along at least the first direction at a rate equal to M times the rate at which the mask table is moved; and
   a correction device comprising a filter unit placed in the path of the projection beam, said filter unit varying the spatial intensity of the beam along at least one direction of its cross-section so that the integrated radiation intensity at substrate level is substantially uniform across substantially the entire length of that cross-section; and
   wherein said filter unit comprises a first member located in the path of the beam, said first member being a first filter which is movable along a movement axis; and
   wherein said first member further comprises a second filter, said second filter being movable relative to said first filter.

2. A lithographic projection apparatus according to claim 1, wherein the first and second filters have a plurality of linear transmission profiles substantially perpendicular to the movement axis, the first and second filters being oriented with respect to one another such that at least one transmission profile on each of the first and second filters can overlap one another and the linear transmission profiles perpendicular to the movement axis on the first filter slope in opposite direction to the linear transmission profiles on the second filter.

3. A lithographic projection apparatus according to claim 2, wherein the first filter has a plurality of transmission profiles arranged parallel to one another along the movement axis, such that a desired transmission profile can be selected by moving the first filter along the movement axis, wherein said movement axis is parallel to said first direction along which said mask table is moved.

4. A lithographic projection apparatus according to claim 3, wherein the plurality of transmission profiles substantially form a continuum of transmission profiles.

5. A lithographic projection apparatus according to claim 1, wherein the first and second filters are grey filters.

6. A lithographic projection apparatus according to claim 2, wherein the correction device further comprises a moving unit constructed and arranged to move the first member.

7. A lithographic projection apparatus according to claim 6, wherein the correction device further comprises a control unit being provided to move the filter unit such that optimum uniformity of the integrated intensity of the beam at substrate level is achieved.

8. A lithographic projection apparatus according to claim 1, wherein said first member comprises at least one filter in which the transmission varies with position through a variation of the density of radiation blocking dots.

9. A lithographic apparatus according to claim 8, wherein the density of said dots is obtained according to digital halftoning.

10. A lithographic apparatus according to claim 8, wherein said filter is located away from an image plane.

11. A lithographic projection apparatus according to claim 1, further comprising a plurality of said first members.

12. A lithographic projection apparatus according to claim 11, wherein each first member is for correcting a respective order of the power-expansion of the intensity profile of the beam.

13. A lithographic projection apparatus according to claim 11, wherein said plurality of first members is arranged in a stack.

14. A lithographic projection apparatus according to claim 1, wherein the filter unit is located proximate to a mask level or a position optically conjugate to said mask level.

15. A lithographic projection apparatus according to claim 14, wherein the filter unit is located immediately above the level of the mask.

16. A lithographic projection apparatus according to claim 15, further comprising beam-shaping optics located between the mask and the source of radiation, the filter unit being placed between the beam-shaping optics and the mask.

17. A lithographic projection apparatus according to claim 1, wherein the percentage variation in the uniformity of the integrated radiation intensity at substrate level is less than 1.5%.

18. A lithographic projection apparatus according to claim 1, wherein the percentage variation in the uniformity of the integrated radiation intensity at substrate level is less than 0.5%.

19. A correction device for a lithographic projection apparatus, said apparatus having a projection system that projects a beam of radiation via a mask onto a substrate, comprising; a filter unit placed in a path of the beam, said filter unit varying a spatial intensity of the beam along at least one direction of its cross-section so that the integrated radiation intensity at substrate level is substantially uniform across substantially the entire length of said cross-section; and wherein said filter unit comprises a first member located in the path of the beam, said first member being a first filter which is movable along a movement axis; and wherein said first member further comprises a second filter, said second filter being movable relative to said first filter.

20. A device manufacturing method comprising:

illuminating a mask with a beam of radiation, said mask containing a pattern;

projecting at least part of the mask pattern produced by said illuminating with a beam of radiation onto a target area of a layer of energy-sensitive material of a substrate which is at least partially covered by said layer of energy-sensitive material; and varying a spatial intensity of the beam along at least one direction of its cross-section so that an integrated radiation intensity at substrate level is substantially uniform across substantially the entire length of that cross-section.

21. A method according to claim 20, wherein the varying comprises continually controlling the uniformity of a spatial intensity of the beam incident on the substrate is optimized.

22. A device manufactured in accordance with the method of claim 20.

* * * * *